United States Patent
Roux et al.

(10) Patent No.: US 11,415,893 B2
(45) Date of Patent: Aug. 16, 2022

(54) ASSEMBLY FOR USE IN SEMICONDUCTOR PHOTOLITHOGRAPHY AND METHOD OF MANUFACTURING SAME

(71) Applicant: ASML Holding N.V., Veldhoven (NL)

(72) Inventors: Stephen Roux, New Fairfield, CT (US); Christopher William Reed, Fairfield, CT (US)

(73) Assignee: ASML Holding N. V., Veldhoven (NL)

( * ) Notice: Subject to any disclaimer, the term of this patent is extended or adjusted under 35 U.S.C. 154(b) by 0 days.

(21) Appl. No.: 16/760,357

(22) PCT Filed: Oct. 5, 2018

(86) PCT No.: PCT/EP2018/077076
§ 371 (c)(1),
(2) Date: Apr. 29, 2020

(87) PCT Pub. No.: WO2019/086198
PCT Pub. Date: May 9, 2019

(65) Prior Publication Data
US 2021/0181640 A1   Jun. 17, 2021

Related U.S. Application Data

(60) Provisional application No. 62/578,572, filed on Oct. 30, 2017.

(51) Int. Cl.
*G03F 7/20* (2006.01)

(52) U.S. Cl.
CPC ........ *G03F 7/7015* (2013.01); *G03F 7/70141* (2013.01); *G03F 7/70825* (2013.01)

(58) Field of Classification Search
CPC .............. G03F 7/7015; G03F 7/70141; G03F 7/70825
See application file for complete search history.

(56) References Cited

U.S. PATENT DOCUMENTS 5,902,326 A * 5/1999 Lessar .................... A61B 5/076
                                                                607/36
6,734,949 B2   5/2004 Franken
6,825,998 B2   11/2004 Yoshida
(Continued)

FOREIGN PATENT DOCUMENTS

DE   102014222952 A1   7/2015
DE   102018208783 A1   7/2018
(Continued)

OTHER PUBLICATIONS

International Search Report and Written Opinion of the International Searching Authority directed to related International Patent Application No. PCT/EP2018/077076, dated Jan. 22, 2019; 11 pages.
(Continued)

*Primary Examiner* — Steven Whitesell Gordon
(74) *Attorney, Agent, or Firm* — Sterne, Kessler, Goldstein & Fox P.L.L.C.

(57) ABSTRACT

An optical assembly and a method of making an optical assembly in which additive manufacturing techniques are used to form a support structure either directly on an optical element or on a carrier that is subsequently bonded to an optical element.

20 Claims, 11 Drawing Sheets

(56) References Cited

U.S. PATENT DOCUMENTS

| | | |
|---|---|---|
| 7,113,263 B2 | 9/2006 | Ebinuma et al. |
| 7,612,956 B2 | 11/2009 | Blanding et al. |
| 8,598,549 B2 * | 12/2013 | Bowering ............ G02B 5/0891 |
| | | 250/492.1 |
| 9,604,299 B2 | 3/2017 | Schoeppach et al. |
| 10,509,336 B2 | 12/2019 | Kaller et al. |
| 2004/0202898 A1 * | 10/2004 | Van Dijsseldonk ... G02B 7/185 |
| | | 428/701 |
| 2005/0110973 A1 | 5/2005 | Streefkerk et al. |
| 2008/0204908 A1 | 8/2008 | Blanding et al. |
| 2009/0147386 A1 * | 6/2009 | Sogard ................ G03F 7/70891 |
| | | 359/845 |
| 2009/0219634 A1 | 9/2009 | Blanding et al. |
| 2009/0244508 A1 | 10/2009 | Schoeppach et al. |
| 2011/0109891 A1 * | 5/2011 | Farnsworth ......... G03F 7/70825 |
| | | 355/67 |
| 2015/0044084 A1 | 2/2015 | Hofmann et al. |
| 2017/0261860 A1 | 9/2017 | Pilz et al. |
| 2021/0026132 A1 * | 1/2021 | Pascall .................. B33Y 80/00 |

FOREIGN PATENT DOCUMENTS

| | | |
|---|---|---|
| EP | 3 202 573 A1 | 8/2017 |
| JP | S63-064011 A | 3/1988 |
| JP | H11-287936 A | 10/1999 |
| JP | 2000-056113 A | 2/2000 |
| JP | 2001-051174 A | 2/2001 |
| JP | 2001-343576 A | 12/2001 |
| JP | 2002-267907 A | 9/2002 |
| JP | 2003-188066 A | 7/2003 |
| JP | 2004-126502 A | 4/2004 |
| JP | 2004-258273 A | 9/2004 |
| JP | 2010-507911 A | 3/2010 |
| JP | 2010-520501 A | 6/2010 |
| JP | 2017-538164 A | 12/2017 |
| WO | WO 03/050586 A2 | 6/2003 |
| WO | WO 2015/074677 A1 | 5/2015 |
| WO | WO 2016/086983 A1 | 6/2016 |
| WO | WO-2016091486 A1 * | 6/2016 ........... G02B 5/1861 |

OTHER PUBLICATIONS

International Preliminary Report on Patentability directed to related International Patent Application No. PCT/EP2018/077076, dated May 5, 2020; 8 pages.

* cited by examiner

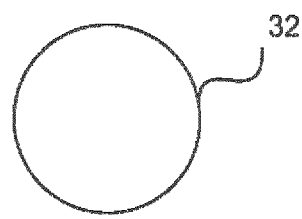
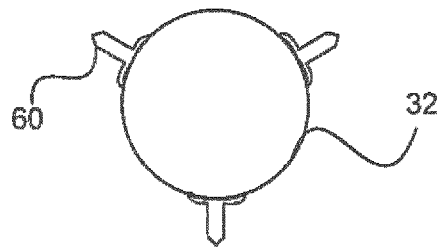
FIG. 6A　　　　　　FIG. 6B
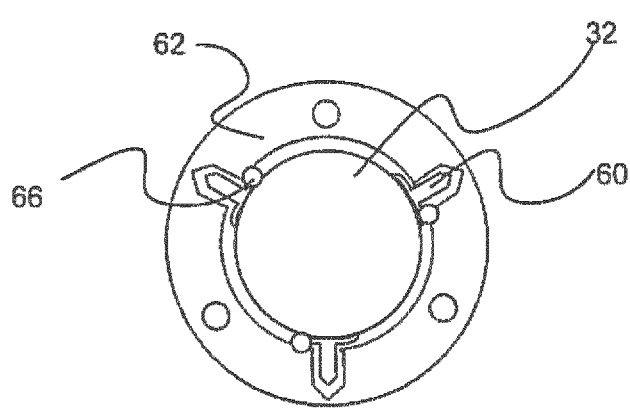
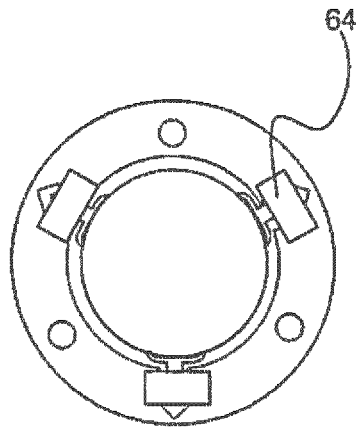
FIG. 6C　　　　　　FIG. 6D

ASSEMBLY FOR USE IN SEMICONDUCTOR PHOTOLITHOGRAPHY AND METHOD OF MANUFACTURING SAME

CROSS-REFERENCE TO RELATED APPLICATIONS

This application claims priority of U.S. Provisional Patent Application No. 62/578,572, which was filed on Oct. 30, 2017, and which is incorporated herein in its entirety by reference.

FIELD

The present disclosure relates to assemblies such as might be used in a lithography apparatus and methods of making and aligning such assemblies.

BACKGROUND

A lithographic apparatus is a machine that applies a desired pattern onto a substrate such as a wafer of semiconductor material, usually onto a target portion of the substrate. A patterning device, which is alternatively referred to as a mask or a reticle, may be used to generate a circuit pattern to be formed on an individual layer of the wafer. Transfer of the pattern is typically accomplished by imaging onto a layer of radiation-sensitive material (resist) provided on the substrate. In general, a single substrate will contain adjacent target portions that are successively patterned. There are also technologies referred to as maskless lithography in which the pattern is transferred by modulating a mirror array.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

Many lithography tools in use today employ lasers as a light source and operate in the deep ultraviolet (DUV) portion of the spectrum, typically 248 nm or 193 nm. In order to shorten the exposure wavelength and, thus, reduce the minimum printable size, extreme ultraviolet (EUV) radiation source is used. EUV radiation is electromagnetic radiation having a wavelength within the range of about 5 nm to about 20 nm, for example within the range of about 13 nm to about 14 nm, and even wavelengths of less than 10 nm, for example within the range of about 5 to about 10 nm such as 6.7 nm or 6.8 nm. Possible sources of EUV radiation include, for example, laser-produced plasma sources, discharge plasma sources, or sources based on synchrotron radiation provided by an electron storage ring. Both DUV and EUV radiation are referred to as light even though they do not reside in the visible portion of the electromagnetic spectrum.

Lithographic equipment incorporates a wide variety of components. These include reflective or transmissive optical elements such as prisms, lenses, mirrors, apertures, and other elements that manipulate the polarization, phase, coherence, etc. of light for fabrication as well as for monitoring (of intensity or other properties of light) and/or sensing conditions such as focus and alignment. These also include support structures and mounting structures such as glass like structures made of, for example, low expansion ceramics used for reticle holding, e.g., a the reticle stage chuck and ferrules for optical fibers.

These components must typically be joined to other components, for example, an optical component to a mounting structure, in a way that is extremely stable. The optical component may be made of glass, and it is necessary to mechanically couple the optical component to a mounting block made of, for example, metal. Although metal is used in this example, it will be understood that the mounting blocks may also be made of other materials such as plastic, composite materials, or ceramics. Conventionally any one of several methods may be used to attach glass to metal, including adhesives such as epoxy, mechanical fasteners such as spring clips, frictional engagement, optical bonding, or hydroxyl bonding. All of these methods have disadvantages. For example, epoxy is hygroscopic and changes dimension with humidity. When it takes up water (or later desorbs that water due to a change in humidity, for instance) it expands (or contracts) thus causing instability in the relative position of objects it is joining, such as, for example, as in encoder scales, fiducial plates, prisms and other optics. Epoxy suffers from peeling when loaded in peel. Epoxy has a high coefficient of thermal expansion which can be almost an order of magnitude larger than that for metals and two orders of magnitude larger than that for ultra low expansion (ULE) glass. Also, because epoxy creeps under load it causes long term stability issues. Epoxy is also known to fail in adhesion to glass or metal substrates and cause complete failure of the assembly.

SUMMARY

It is desirable to obviate or mitigate at least one of the problems, whether identified herein or elsewhere, or to provide an alternative to existing apparatus or methods.

According to one aspect there is disclosed the use of additive manufacturing techniques to minimize and even eliminate reliance on an intermediate adhesive layer made, for example, of epoxy as a bonding agent. Additive manufacturing is used herein in its conventional sense as referring to technologies that permit the creation of three dimensional structures incrementally using successive layers of one or more materials. It is intended to encompass, for example, technologies such as 3D printing, rapid prototyping, direct digital manufacturing, layered manufacturing, and additive fabrication. In essence, replacing the adhesive bonds with covalent metallic bonds avoids many of the problems described above.

According to one aspect, disclosed is an article of manufacture comprising a component of a lithography apparatus and a support structure formed on the component using additive manufacturing, the support structure comprising a transitional interface portion having a lattice structure and wherein the lattice structure is formed on the component. The component may be an optical element comprising, for example, glass, metal, a ceramic material, or a composite material. The component may have an adhesion layer in which case the support structure may be formed on the adhesion layer. The adhesion layer may be a sputtered adhesion layer. The support structure may comprise a metallic material. The support structure may comprise a first metallic material and a second metallic material and further comprise a first region comprising a higher concentration of first metallic material than second metallic material and a second region comprising a higher concentration of second metallic material than first metallic material. The support structure may comprise a first nonmetallic material and a second metallic material and further comprises a first region comprising a higher concentration of first nonmetallic material than second metallic material and a second region comprising a higher concentration of second nonmetallic material than first metallic material. The first nonmetallic material may comprise a glass material. The lattice structure may comprise at least one flexure.

According to another aspect disclosed is an article of manufacture comprising an article of manufacture comprising an optical element and a support structure adhered to the optical element using brazing. The optical element may have an adhesion layer in which case the support structure may be adhered to the adhesion layer. The adhesion layer may be a sputtered adhesion layer. The support structure may include a transition interface region having a lattice structure in which case the portion having a lattice structure may be adhered to the optical element. The lattice structure may comprise at least one flexure. The support structure may be fabricated using additive manufacturing.

According to another aspect disclosed is an article of manufacture comprising a carrier, a support structure formed on the carrier using additive manufacturing, and an optical element optically contacted to the carrier. The carrier may comprise, for example, comprise glass, a glass ceramic composite material, or a ceramic material.

According to another aspect disclosed is a method of making an article, the method comprising the steps of providing a component of a lithography apparatus and forming a support structure on the component using additive manufacturing, the support structure comprising a transitional interface portion having a lattice structure and wherein the lattice structure is formed on the component. The forming step may comprise 3D printing the support structure on the component. The method may comprise a step before the forming step of providing the component with an adhesion layer in which case the forming step may comprise forming the support structure on the adhesion layer. The step of providing the adhesion layer may comprise, for example, sputtering the adhesion layer onto a surface of the component, depositing an adhesion layer onto a surface of the component by evaporation, or depositing an adhesion layer onto a surface of the optical element by a PVD or a CVD process. The lattice structure may comprise at least one flexure.

According to another aspect disclosed is a method of making an article, the method comprising the steps of providing a carrier, forming a support structure on the carrier using additive manufacturing, providing an optical element, and optically contacting the carrier to the optical element. The forming step may comprise 3D printing the support structure on the carrier. The method may additionally include a further step before the forming step of providing the carrier with an adhesion layer in which case the forming step may comprise forming the support structure on the adhesion layer. The lattice structure may comprises at least one flexure.

According to another aspect disclosed is a method comprising the steps of providing an unfinished optical element, forming a support structure on the unfinished optical element, and finishing the optical element. The unfinished optical element may for example be an optical blank or a partially finished optical blank.

According to another aspect disclosed is a method comprising the steps of providing an optical element, attaching at least one metallic flange to the optical element using additive manufacturing, and connecting the at least one metallic flange to a support structure.

According to another aspect disclosed is a method comprising the steps of providing a carrier, providing a support structure, joining the carrier to the support structure using brazing, providing an optical element, and optically contacting the carrier to the optical element.

According to another aspect disclosed is a method of making an article, the method comprising the steps of providing a tooling comprising at least one fiducial, placing a component of a lithography system in the tooling in a fixed relation to the tooling, 3D printing a feature on the at least one fiducial, determining a print offset based on a position of the printed feature on the at least one fiducial, and 3D printing on the component using the determined print offset.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWING

The accompanying drawings, which are incorporated herein and form part of the specification, illustrate the present invention and, together with the description, further serve to explain the principles of the present invention and to enable a person skilled in the relevant art(s) to make and use the present invention.

FIGS. 6A-6D are plan views of an optical assembly according to an embodiment.

Figure 1:
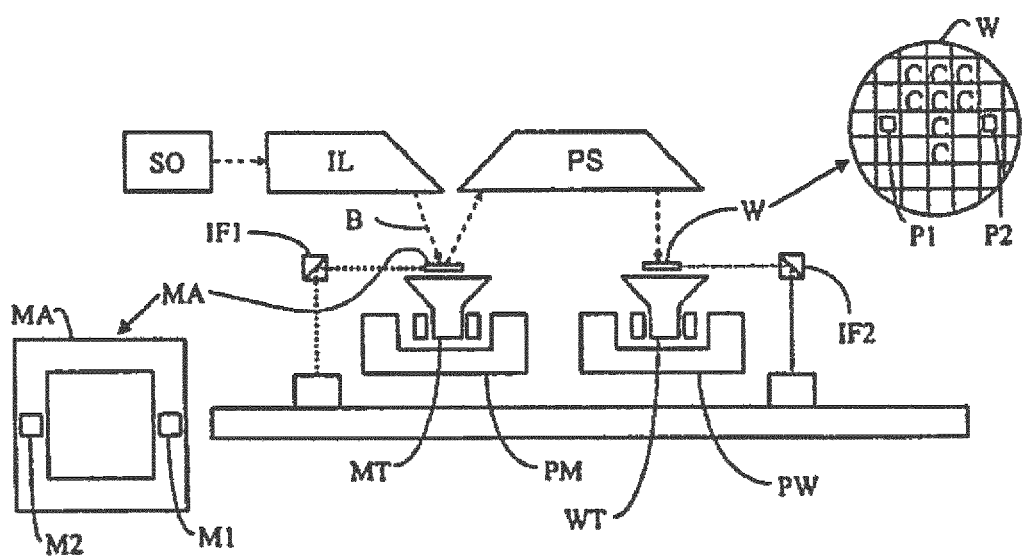
FIG. 1 shows a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of the subject matter disclosed and claimed herein. The disclosed embodiments merely exemplify that subject matter. The scope of the present invention is not limited to the disclosed embodiments. The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, it is instructive to present an example environment in which embodiments of the present invention may be implemented.

FIG. 1 schematically shows a lithographic apparatus including a source collector module SO according to an embodiment of the present invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As depicted the apparatus is of a reflective type (e.g., employing a reflective mask). The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam and exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as faceted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of several modes. For example, in a step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

In a scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
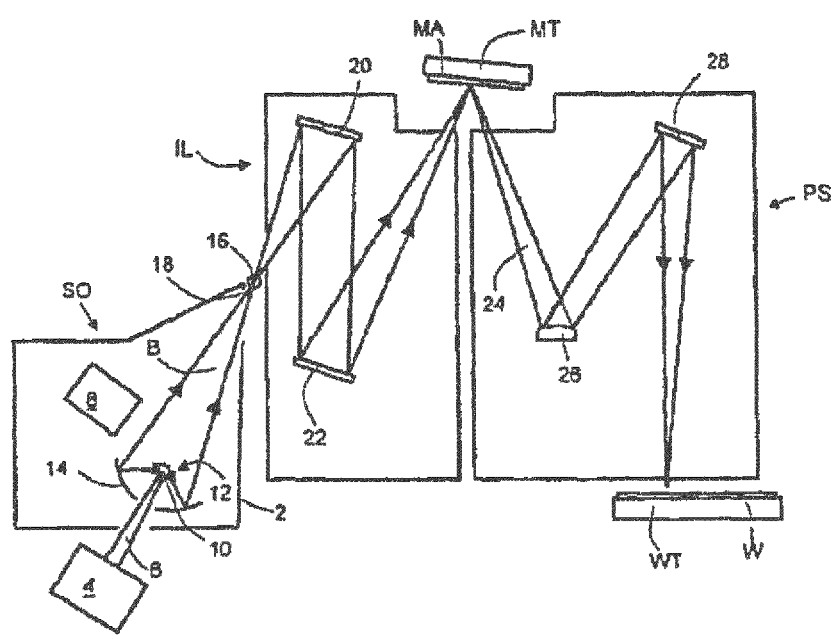
FIG. 2 is a more detailed view of the apparatus of FIG. 1 according to an embodiment.

FIG. 2 shows the lithographic apparatus LAP in more detail, including the source collector module SO, the illumination system IL, and the projection system PS. The source collector module SO is constructed and arranged such that a vacuum environment can be maintained in an enclosing structure 2 of the source collector module.

A laser 4 is arranged to deposit laser energy via a laser beam 6 into a volume of fuel, such as xenon (Xe), tin (Sn) or lithium (Li) that is provided from a fuel supply 8 (sometimes referred to as a fuel stream generator). Tin, or another molten metal or intermetallic (most likely in the form of droplets) is currently thought to be the most promising and thus likely choice of fuel for EUV radiation sources. The deposition of laser energy into the fuel creates a highly ionized plasma 10 at a plasma formation location 12 that has electron temperatures of several tens of electron volts (eV). The energetic radiation generated during de-excitation and recombination of these ions is emitted from the plasma 10, collected and focused by a near normal incidence radiation collector 14. A laser 4 and a fuel supply 8 (and/or a collector 14) may together be considered to comprise a radiation source, specifically an EUV radiation source. The EUV radiation source may be referred to as a laser produced plasma (LPP) radiation source.

A second laser (not shown) may be provided, the second laser being configured to preheat or otherwise precondition the volume of fuel before the laser beam 6 is incident upon it. An LPP source that uses this approach may be referred to as a dual laser pulsing (DLP) source.

Although not shown, the fuel stream generator will comprise, or be in connection with, a nozzle configured to direct a stream of fuel droplets along a trajectory towards the plasma formation location 12.

Radiation B that is reflected by the radiation collector 14 is focused at a virtual source point 16. The virtual source point 16 is commonly referred to as the intermediate focus, and the source collector module SO is arranged such that the intermediate focus 16 is located at or near to an opening 18 in the enclosing structure 2. The virtual source point 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures, for example there may be additional reflective elements present in the projection system PS than shown in FIG. 2.

Such an EUV lithographic system, and a DUV system, includes components such as optical elements that must be positioned with great precision and in a way that maintains that precise positioning over an extended period of time. This typically involves mechanically securing such components within a housing which is in turn secured using, for example, mechanical fasteners such as bolts or clamps.

According to one aspect, to avoid these issues, a mounting structure is formed directly on the component or on a carrier that is coupled to the component. A mounting structure of an appropriate material (e.g., metal) may be printed directly on the component. 3D printing of materials such as metals (e.g., stainless steel, invar, titanium, kovar, pure nickel), pure or alloyed or ceramics and/or ceramic/metal compounds may be used.

Direct metal printing on such components may induce stresses. The resultant assembly may also be subject to heat induced stresses due to mismatches in the coefficients of thermal expansion of the underlying component and the material(s) printed on the component. These forces can be managed using 3D printing to create a mounting structure with a transitional interface portion. The structure is built up incrementally from the transitional interface portion to a more solid mounting portion suitable for mechanical coupling to other system components. The transitional interface portion may be in the form, for example, of a lattice which may include pillars, dendritic structures, whiffletree structures of many small slender bars or struts that distribute force evenly through linkages, flexures, or other elements or combinations of elements. As used herein, the term lattice refers to structures that are ordered, for example, have periodicity or translational symmetry, or are disordered with no periodicity, or a combination of ordered and disordered. The transitional interface portion may culminate in an ordered or disordered array of small tips that make direct physical contact with the component.

The transitional interface portion in this embodiment is in essence a flex layer created, for example, in a 3D printer, that manages the stress from 3D printing, as well as other stresses. These other stresses may include stresses induced by mismatches in the coefficients of thermal expansion, transmitted mounting stresses, actuation or alignment stresses, stresses due to surface figure or stress birefringence optimization, and stresses due to tuning for dynamics. The transitional interface portion may also provide distributed stiffness to the component. This use of 3D printing makes it possible to avoid the use of any adhesive or other polymer anywhere in the load path between the component and the remainder of the system so that only metallic (covalent) bonds exist between the component and, for example, the housing that contains it. An additional advantage is that this use of 3D printing makes it possible to avoid relying on technician skill in applying an adhesive such as epoxy. It also permits construction using fewer materials.

Alternatively the mounting structure may be manufactured separately and then attached to the component using a technique such as brazing. One challenge is that for designs relating to optical components the glass-to-metal joint made by brazing is subjected to high temperature processes that impart large stresses to the final assembly. These locked-in stresses cause distortion of the optics and possibly instability if there is relaxation of the stresses later on. The lack of the ability to sufficiently match the coefficients of thermal expansion for the optical component and the mounting structure may be extremely challenging. This can also be addressed by forming the support structure in such a way as to create a transitional interface portion with a surface of small tip structures to interface with the optical element. These tips are then attached to the optical element using furnace brazing with a suitable filler material and brazing process. Induction brazing may also be used. Once the optical component and the mounting structure are connected stress-induced distortion will be minimized due to the structural inability of the transitional interface portion to transmit any substantial force due to the small size and optimized geometry of its features.

The mounting structure may be made of a single material or it may be made of multiple materials. Thus, one of the transitional interface region and the mechanical attachment region may be made predominantly of, for example, stainless steel with the material transitioning to another material such as invar for the other region. In other words, it may for some applications be desirable to start at the optical element surface (e.g., glass surface) perhaps with one additive manufacturing material such as a particular metal, glass, or a mixture of metal and glass and transition gradually or abruptly to another material, e.g., all metal as the layers of the mounting structure are built up. using additive manufacturing. This can be accomplished using additive manufacturing techniques by changing the composition of the material (in the form, for example, of a powder or wire) used to create the layers during the process of making the layers.

The mounting structure is provided with interfaces for mechanically coupling the mounting structure to one or more other components in the system such as by clamping to a housing, or stage or other structure. These interfaces are connected to mechanical attachment regions of the mounting structure that are sufficiently distinct from the transitional interface region that they have the necessary rigidity and strength, for example, in a solid (nonporous) bulk material portion of the mounting structure.

Figure 3A:
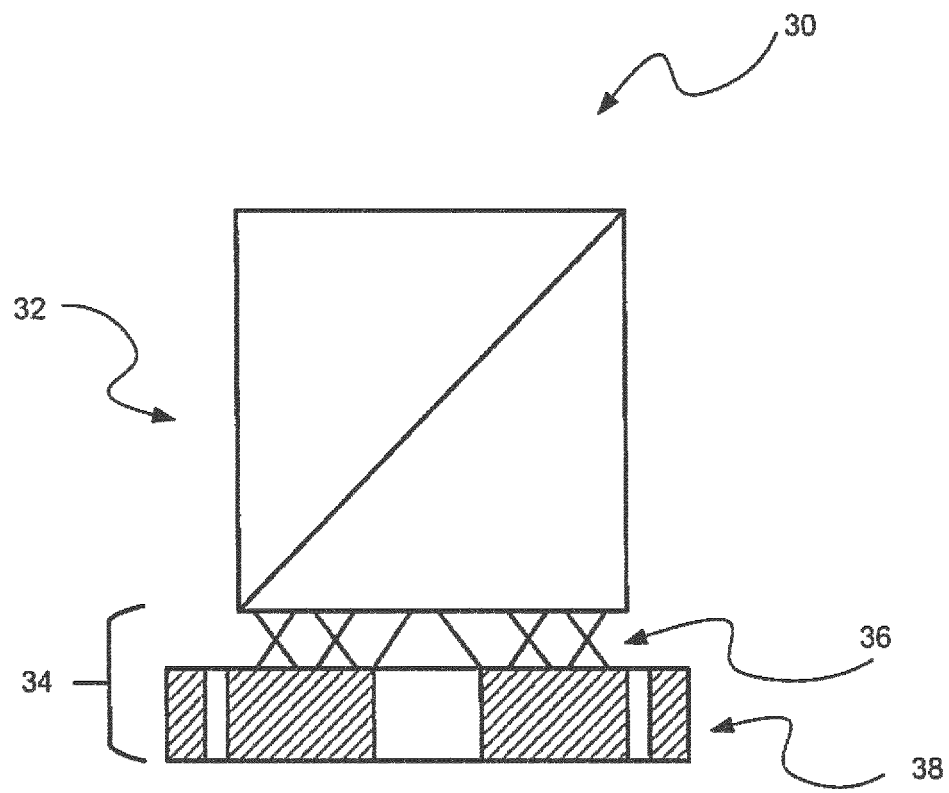
FIG. 3A is a plan partially diagrammatic view of an optical assembly according to an embodiment.

Referring now to FIG. 3A, there is shown an example in which optical assembly 30 having an optical element 32 and a mounting structure 34. The optical assembly 30 may be, for example, a prism made of glass. The mounting structure 34 may be made of a metal such as Invar. The mounting structure 34 includes a transitional interface portion 36 and a mechanical attachment region 38. The transitional interface portion 36 is depicted as a group of finger-shaped elements but it will be understood that their size is greatly exaggerated for the sake of illustration and that in general these structures will be small and can have varying geometries. Also in FIG. 3A the change between the transitional interface portion 36 and the mechanical attachment region is shown as being abrupt but it will be understood that this change may be gradual. In practice there may be an aperture in the mounting structure 34 to permit light access to the optical element 32, and it will be necessary to keep the elements of the transitional interface portion 36 clear of this aperture. The mechanical attachment region 38 may include an integral 3D printed baseplate with holes, bosses, and the aperture. Features may be added to the mounting structure 34 to optimize alignment and attachment to the next assembly level.

Figure 3B:
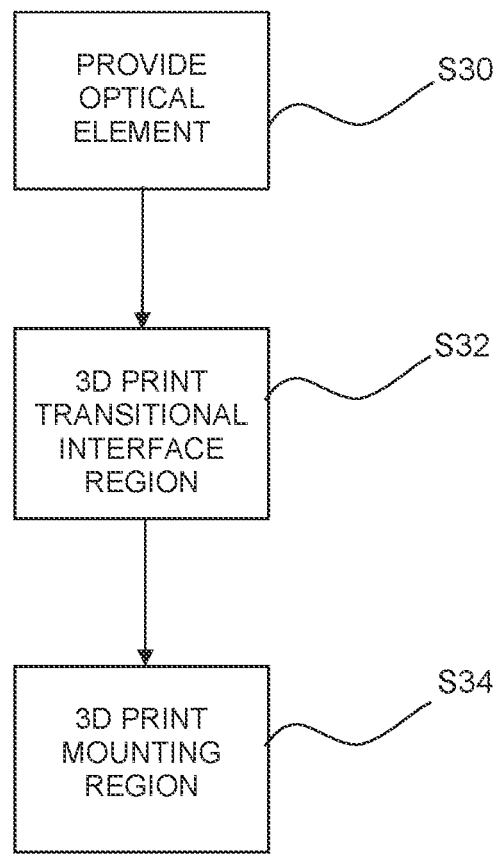
FIG. 3B is a flowchart describing a method of making an optical assembly such as that shown in FIG. 3A.

Thus, as shown in FIG. 3B, a method of making an optical assembly may include a step S30 of providing an optical element, a step S32 of 3D printing a transitional interface region on the optical element, and then a step S34 printing a mounting region on the transitional interface region. It will be understood that steps S32 and S34 need not be discrete, and that the process may gradually transition from one step to the next.

Figure 4A:
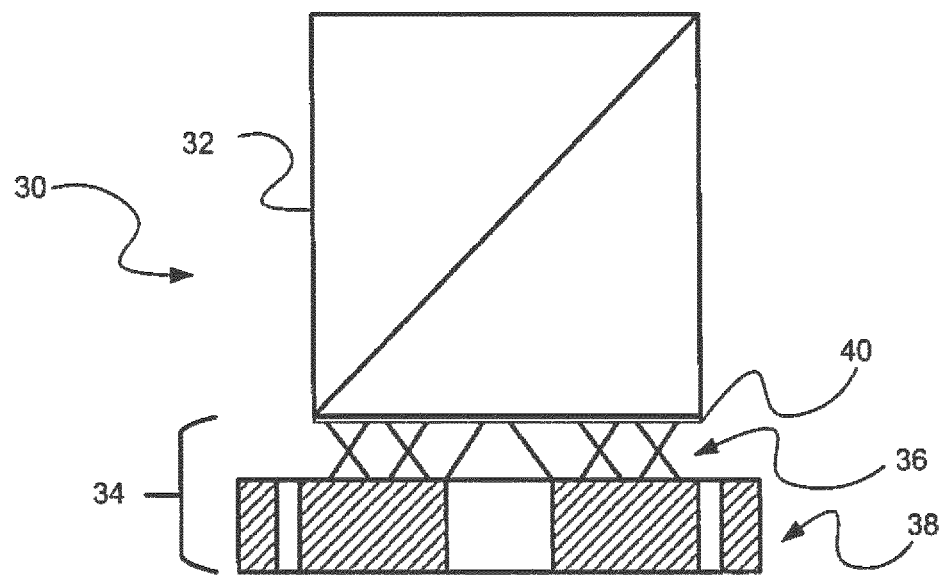
FIG. 4A is a plan partially diagrammatic view of another optical assembly according to an embodiment.
Figure 4B:
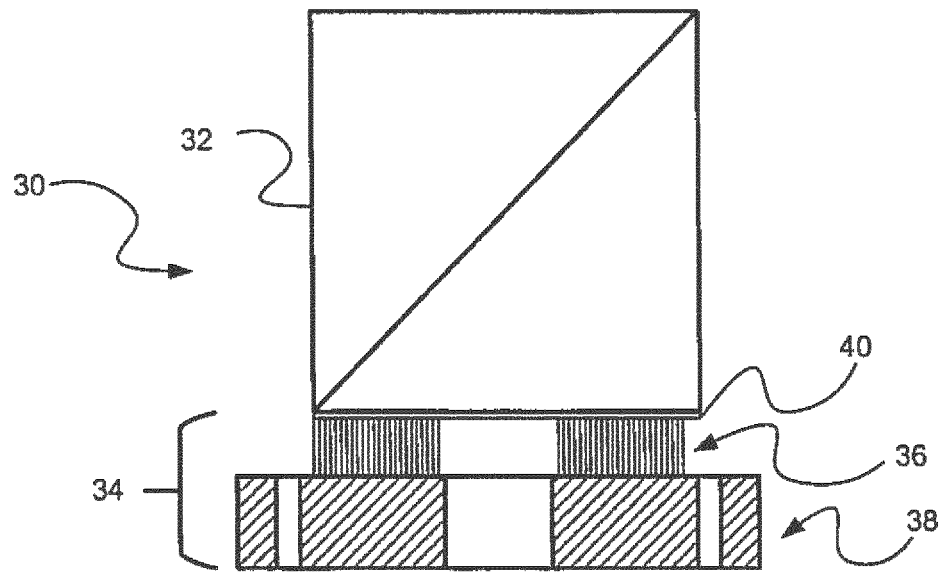
FIG. 4B is a plan partially diagrammatic view of yet another optical assembly according to an embodiment.
Figure 4C:
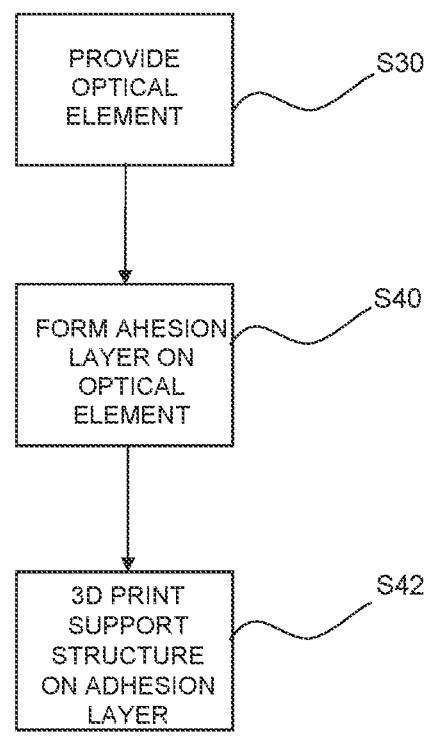
FIG. 4C is a flowchart describing a method of making an optical assembly such as that shown in FIG. 4A.

As shown in FIG. 4A it may be desirable in some applications to provide an adhesion layer 40 on the optical element 32 and then print the mounting structure 34 on the adhesion layer. It will be understood that in FIG. 4A the thickness of the adhesion layer 30 is exaggerated and that in general this layer may be quite thin because of the difficulty inherent in building up a thicker layer. The adhesion layer may be made, for example, from chromium and may be applied by sputtering, evaporation or other similar PVD/CVD processes. Thus, as shown in FIG. 4C, a method of making an optical assembly may include a step S30 of providing an optical element, a step S40 of forming and adhesion layer on the optical element, and a step S42 of 3D printing a support structure on the adhesion layer.

As noted, in FIG. 3A and FIG. 4A, transitional interface portion 36 is depicted as a group of finger-shaped elements with their size is greatly exaggerated for the sake of illustration. It is not necessary that the elements of the group cross each other and extend at an angle as shown in in FIG. 3A as in FIG. 4A. The transitional interface portion 36 can have other arrangements. For example, as shown in FIG. 4B the transitional interface portion 36 can be configured as a large array of straight hairs or pillars all substantially parallel to each other. This array may be ordered as shown or may be disordered. Also, the transitional interface portion 36 may be configured as a combination of ordered and disordered elements.

In the foregoing description the mounting structure 34 is coupled directly to the optical element 32. As shown in FIG. 5A, it is also possible to couple the mounting structure 34 to an intermediate structure 50, i.e., carrier, such as a bulk ULE glass stage body which is then in turn coupled to the optical element 32. The intermediate structure 50 may also be made of ceramic or a glass ceramic composite such as Zerodur®. If this intermediate structure 50 is to be optically contacted to the optical element 32 then it may be necessary to optically polish the surface of the intermediate structure 50 that will be optically contacted to the optical element 32. Once this optical contact is made the entire mounting structure/intermediate structure/optical element assembly may subjected to a furnace heating cycle in order to create a fusion bond between the intermediate structure 50 and optical element 32, which both may be ULE glass. Since the metal-to-intermediate structure joint is optimized for flexibility during large temperature excursions the residual stress of the fully fired part is low and final flattening steps will not be subjected to drift. Some tooling may be required to ensure there is no loss of contact between the intermediate structure 50 and the optical element 32 during fusion, or the assembly may be oriented so that gravity can inhibit contact loss.

If direct metal printing on a glass carrier is used, the glass carrier can be post-polished and touched up and then optically contacted to the optical element 32 in question. If this arrangement is used then it may be possible to forego the transition interface region unless it is necessary to manage stress caused by 3D printing. This method also has the advantage of metallic and optically contacted bonds from the optical element 32 to the components to which it is mounted, such as its housing. Also, optical surfaces are not exposed to 3D printing environment. It may also, however, require adaptation of alignment techniques and does require an optical contacting step.

Figure 5B:
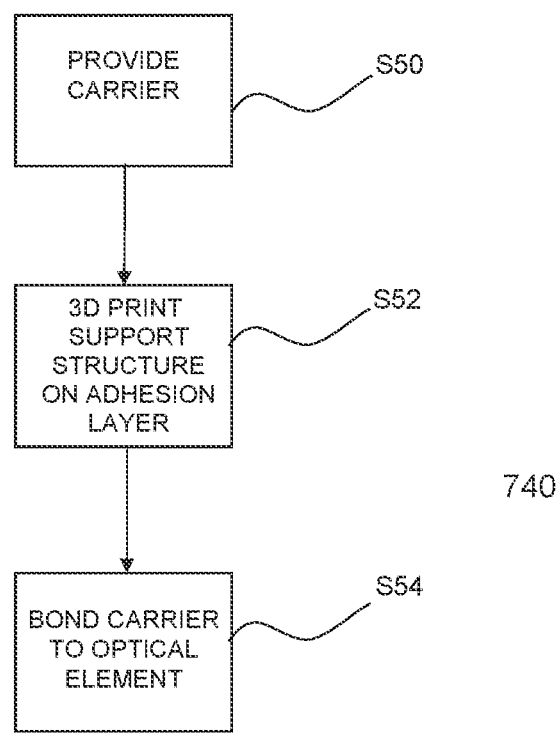
FIG. 5B is a flowchart describing a method of making an optical assembly such as that shown in FIG. 5A.
Figure 5A:
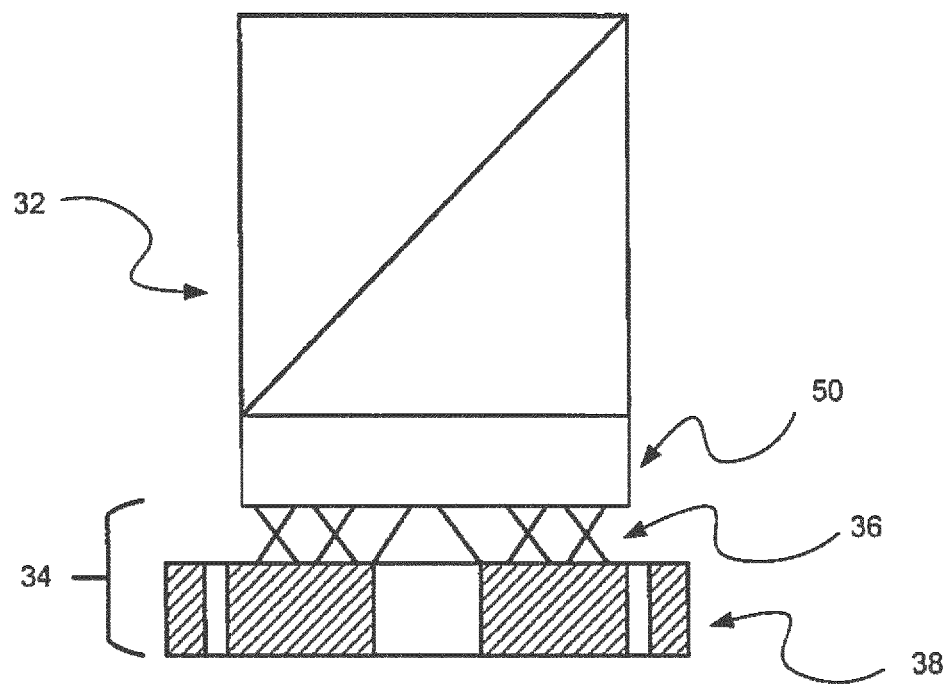
FIG. 5A is a plan partially diagrammatic view of another optical assembly according to an embodiment.

Thus, as shown in FIG. 5B, a method of making an optical assembly may include a step S50 of providing a carrier, a step S52 of 3D printing a support structure on the carrier, and a step S54 of bonding the carrier to an optical element.

Such arrangements can be advantageously employed in all optical glass to metal or ceramic to metal systems where stability is important, including stages, sensors, any glass-to-metal bond, and ceramic-to-metal construction by using additive manufacturing to create a suitable metal structure that transitions from a strong bulk structure to a transitional interface region that inherently lacks the ability to transmit significant amounts of distortion.

3D print tolerances are currently on the order of 50 um which is greater than the tolerances generally permitted in aligning the semiconductor lithography components for some applications. To compensate for this it may be desirable for these applications to make a mounting structure out of one or more parts, align the parts, and then join these parts together using, for example, e-beam welding, laser welding, or a mechanical fastening or clamping mechanism.

The use of additive manufacturing techniques also may require adaptation of techniques for alignment of the optical element as well as tooling to protect optical surfaces during additive manufacturing.

In the case of printing directly on some types of components such as an optical element it may be necessary to protect the component. For this purpose taping, masking or a clamping tooling may be used. Once assembled and aligned the optical axis will be aligned in tilts and Z to the reference surfaces on the flange.

As shown in FIGS. 6A-6D, one fabrication technique may involve the use of using additive manufacturing to create tab structures 60 (FIG. 6B) on the periphery of a component such as the optical element 32 and then attach these tabs 60 to a support structure using, for example, a laser weld or if desired an e-beam weld joint 64 (FIG. 6D) or a laser tack weld followed by an e-beam weld to minimize stress and heat.

In one method, the optical axis of the optical element 32 can be aligned with respect to one or more reference surfaces on the support structure (flange). The optical element 32 and the support structure 62 can be locked in alignment using epoxy 66 (FIG. 6C). The assembly can then be moved from the alignment tool to a welding tool and welded to make the aligned orientation permanent. It may be desirable to confirm alignment still exists after the welding step is completed. If desired, the epoxy can then be removed.

Figure 6E:
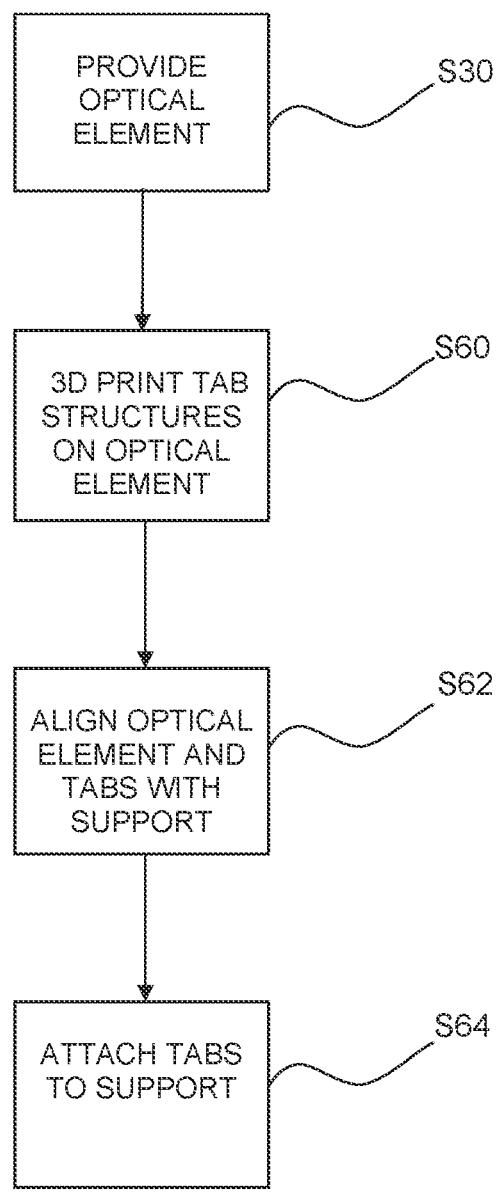
FIG. 6E is a flowchart describing a method of making an optical assembly such as that shown in FIGS. 6A-6D.

Thus, as shown in FIG. 6E, a method of making an optical assembly may include a step S30 of providing an optical element, a step S60 of tab structures (which may include some or all of the above described distortion limiting structures and techniques) on the optical element; a step S62 of aligning the combination of the optical element and the tabs with a support, and s step S64 of attaching the tabs structures to the support.

Figure 7A:
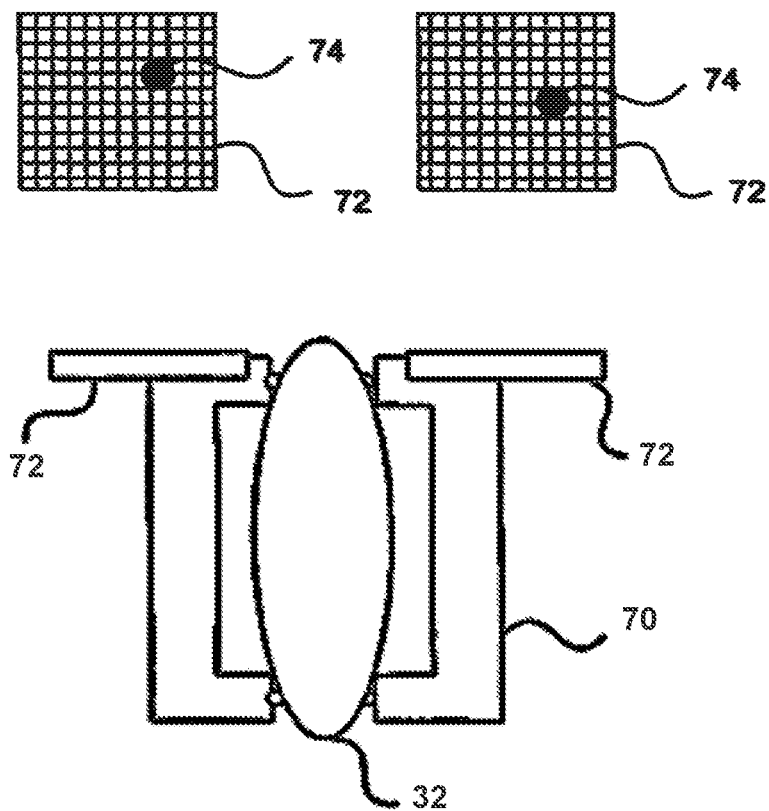
FIG. 7A is a partially diagrammatic plan view of an optical element and tooling for assisting processing of an optical element according to an embodiment.
Figure 7B:
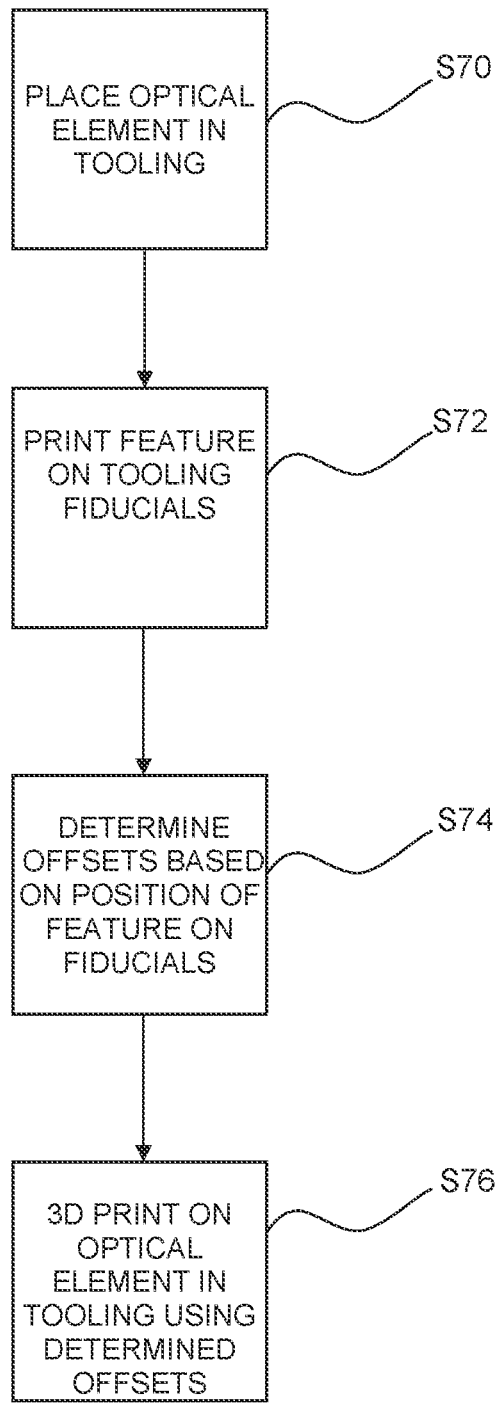
FIG. 7B is a flowchart describing a method of using the tooling shown in FIG. 7A.

According to another method as shown in FIG. 7, the optical element 32 may be mounted in tooling 70 that protects the optical element 32 during the 3D print. The tooling 70 includes tooling fiducials 72. This is shown as step S70 in FIG. 7B. The optical element 32 and tooling 70 are then placed in a 3D printer and a test feature 74 is printed onto the tooling fiducial 72 in a step S72. In a step S74 an offset reading is taken by inspecting the fiducial 72. The offsets as read are programmed into the 3D printer based on measurement of x, y, and Rz (x offset, y offset, and rotation about the z axis offset) and used to 3D print on the optical element in a step S76. Optionally there may be a step of confirming that the registration of the optical element 32 to the tooling fiducial 72 is proper. As an illustration, FIG. 7 shows tooling with two small plates with fiducials 72 in the form of grids on them. Printing a spot 74 on each provides x, y, and Rz offsets which are then used to 3D print accurately on the optical element 32.

The above methods permit registration of parts using fiducials on the tooling. They may include a step of holding the optical assembly relative to the support structure (cell) with epoxy or other temporary means to allow removal and welding outside of the alignment tooling.

In another method, a support structure is printed directly on an optical blank. The optical blank could be finished to a rough shape and figure, after which the support structure would be formed on the blank using additive manufacturing. The blank could then be processed further (e.g., final figuring, polishing and coating as required) to produce the finished optical element. This method would have the additional benefit that any stress and distortion from the metal bonds can be addressed in the subsequent finishing steps.

Also, the support structure may permit very high precision tooling which in final steps in the fabrication of the optical element and for metrology for holding and aligning. Also, because the metal 3D print is done before final polished surfaces are created the tooling requirements could be less stringent.

The embodiments may further be described using the following clauses:

1. An article of manufacture comprising:
   a component of a lithography apparatus; and
   a support structure formed on the component using additive manufacturing, the support structure comprising a transitional interface portion having a lattice structure and wherein the lattice structure is formed on the component.
2. An article of clause 1 wherein the component comprises an optical element comprising glass.
3. An article of clause 1 wherein the component comprises an optical element comprising metal.
4. An article of clause 1 wherein the component comprises an optical element comprising a ceramic material.
5. An article of clause 1 wherein the component comprises an optical element comprising a composite material.
6. An article of clause 1 wherein the component has an adhesion layer and the support structure is formed on the adhesion layer.
7. An article of clause 6 wherein the adhesion layer is a sputtered adhesion layer.
8. An article of clause 1 wherein the support structure comprises a metallic material.
9. An article of clause 1 wherein the support structure comprises a first metallic material and a second metallic material and further comprises a first region comprising a higher concentration of first metallic material than second metallic material and a second region comprising a higher concentration of second metallic material than first metallic material.
10. An article of clause 1 wherein the support structure comprises a first nonmetallic material and a second metallic material and further comprises a first region comprising a higher concentration of first nonmetallic material than second metallic material and a second region comprising a higher concentration of second nonmetallic material than first metallic material.
11. An article of clause 10 wherein first nonmetallic material comprises a glass material.
12. An article of clause 1 wherein the lattice structure comprises at least one flexure.
13. An article of manufacture comprising:
   an optical element; and
   a support structure adhered to the optical element using brazing.
14. An article of clause 13 wherein the optical element has an adhesion layer and the support structure is adhered to the adhesion layer.
15. An article of clause 14 wherein the adhesion layer is a sputtered adhesion layer.
16. An article of clause 15 wherein the support structure includes a transition interface region having a lattice structure and wherein the portion having a lattice structure is adhered to the optical element.
17. An article of clause 16 wherein the lattice structure comprises at least one flexure.
18. An article of clause 13 wherein the support structure is fabricated using additive manufacturing.
19. An article of manufacture comprising:
   a carrier;
   a support structure formed on the carrier using additive manufacturing; and
   an optical element optically contacted to the carrier.
20. An article of clause 19 wherein the carrier comprises glass.
21. An article of clause 19 wherein the carrier comprises a glass ceramic composite material.
22. An article of clause 19 wherein the carrier comprises a ceramic material.
23. A method of making an article, the method comprising the steps of:
   providing a component of a lithography apparatus; and
   forming a support structure on the component using additive manufacturing, the support structure comprising a transitional interface portion having a lattice structure and wherein the lattice structure is formed on the component.
24. A method of clause 23 wherein the forming step comprises 3D printing the support structure on the component.
25. A method of clause 23 further comprising a step before the forming step of providing the component with an adhesion layer and wherein the forming step comprises forming the support structure on the adhesion layer.
26. A method of clause 25 wherein the step of providing the adhesion layer comprises sputtering the adhesion layer onto a surface of the component.
27. A method of clause 25 wherein the step of providing the adhesion layer comprises depositing an adhesion layer onto a surface of the component by evaporation.
28. A method of clause 25 wherein the step of providing the adhesion layer comprises depositing an adhesion layer onto a surface of the optical element by a PVD or a CVD process.
29. A method of clause 23 wherein the lattice structure comprises at least one flexure.
30. A method of making an article, the method comprising the steps of:
   providing a carrier;
   forming a support structure on the carrier using additive manufacturing;
   providing an optical element; and
   optically contacting the carrier to the optical element.
31. A method of clause 30 wherein the forming step comprises 3D printing the support structure on the carrier.
32. A method of clause 30 further comprising a step before the forming step of providing the carrier with an adhesion layer and wherein the forming step comprises forming the support structure on the adhesion layer.
33. A method of clause 30 wherein the lattice structure comprises at least one flexure.
34. A method comprising the steps of:
   providing an unfinished optical element;
   forming a support structure on the unfinished optical element; and
   finishing the optical element.
35. A method of clause 34 wherein the unfinished optical element is an optical blank.
36. A method of clause 34 wherein the unfinished optical element is a partially finished optical blank.
37. A method comprising the steps of:
   providing an optical element;
   attaching at least one metallic flange to the optical element using additive manufacturing; and
   connecting the at least one metallic flange to a support structure.

38. A method of making an article, the method comprising the steps of:
    providing a carrier;
    providing a support structure;
    joining the carrier to the support structure using brazing;
    providing an optical element; and
    optically contacting the carrier to the optical element.

39. A method of making an article, the method comprising the steps of:
    providing a tooling comprising at least one fiducial;
    placing a component of a lithography system in the tooling in a fixed relation to the tooling;
    3D printing a feature on the at least one fiducial;
    determining a print offset based on a position of the printed feature on the at least one fiducial; and
    3D printing on the component using the determined print offset.

While the above description uses an optical component as the primary example of a semiconductor lithography component to the teachings of this disclosure may be applied, it will be apparent to one of ordinary skill in the art that the teachings may also be applied to other semiconductor lithography components such as wafer supports including chucks and reticle supports and the creation of ferrules for optical fibers. Also, although specific reference may be made in this text to the use of semiconductor lithographic apparatus, it should be understood that the subject matter described herein may have other applications, such as the manufacture of integrated optical systems, guidance and detection patterns for magnetic domain memories, flat-panel displays, liquid-crystal displays (LCDs), thin-film magnetic heads, etc. Where applicable, the disclosure herein may be applied to other substrate processing tools.

While specific embodiments of the present invention have been described above, it will be appreciated that the present invention may be practiced otherwise than as described. The descriptions above are intended to be illustrative, not limiting. Thus it will be apparent to one skilled in the art that modifications may be made to the present invention as described without departing from the scope of the claims that follow.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An article of manufacture comprising:
    an optical component of a lithography apparatus, wherein the optical component has an optical surface; and
    a mounting structure configured to support the optical component at the optical surface, the mounting structure comprising:
        a transitional interface portion having a lattice structure formed on the optical surface of the optical component, and
        a mechanical attachment region coupled to the transitional interface portion and arranged such that the optical component and the mechanical attachment region sandwich the transitional interface portion in a stacked manner and such that the mechanical attachment region does not extend closer to the optical surface than the transitional interface portion,
        wherein the mounting structure and the transitional interface portion are configured to permit light to pass through them to impinge the optical surface of the optical component.

2. The article of claim 1, wherein the optical component comprises an optical element comprising glass.

3. The article of claim 1, wherein the optical component comprises an optical element comprising metal.

4. The article of claim 1, wherein the optical component comprises an optical element comprising a ceramic material.

5. The article of claim 1, wherein the optical component comprises an optical element comprising a composite material.

6. The article of claim 1, wherein the optical component has an adhesion layer and the mounting structure is formed on the adhesion layer.

7. The article of claim 6, wherein the adhesion layer has characteristics of a sputtered adhesion layer.

8. The article of claim 1, wherein the mounting structure comprises a metallic material.

9. The article of claim 1, wherein the mounting structure comprises a first metallic material and a second metallic material, and further comprises a first region comprising a higher concentration of first metallic material than the second metallic material, and a second region comprising a higher concentration of second metallic material than the first metallic material.

10. The article of claim 1, wherein the mounting structure comprises a first nonmetallic material and a second metallic material and further comprises a first region comprising a higher concentration of first nonmetallic material than second metallic material and a second region comprising a higher concentration of second nonmetallic material than first metallic material.

11. The article of claim 10, wherein the first nonmetallic material comprises a glass material.

12. The article of claim 1, wherein the lattice structure comprises at least one flexure.

13. An article of manufacture comprising:
an optical element with an optical surface; and
a mounting structure configured to support the optical element at the optical surface, comprising:
   a transitional interface portion having a lattice structure formed on the optical surface of the optical element, at a brazing interface, and
   a mechanical attachment region coupled to the transitional interface portion and arranged such that the optical element and the mechanical attachment region sandwich the transitional interface portion in a stacked manner and such that the mechanical attachment region does not extend closer to the optical surface than the transitional interface portion,
wherein the mounting structure and the transitional interface portion are configured to permit light to pass through them to impinge the optical surface of the optical element.

14. The article of claim 13, wherein the optical element has an adhesion layer and the mounting structure is adhered to the adhesion layer.

15. The article of claim 14, wherein the adhesion layer has characteristics of a sputtered adhesion layer.

16. The article of claim 13, wherein the lattice structure comprises at least one flexure.

17. An article of manufacture comprising:
a carrier with an optical element optically connected thereto, wherein the optical element has an optical surface; and
a mounting structure comprising:
   a transitional interface portion having a lattice structure, and wherein the lattice structure is formed on the carrier and coupled to the optical surface, and
   a mechanical attachment region coupled to the transitional interface portion and arranged such that the optical element and the mechanical attachment region sandwich the transitional interface portion in a stacked manner and such that the mechanical attachment region does not extend closer to the optical surface than the transitional interface portion,
wherein the mounting structure and the transitional interface portion are configured to permit light to pass through them to impinge the optical surface of the optical element.

18. The article of claim 17, wherein the carrier comprises glass.

19. The article of claim 17, wherein the carrier comprises a glass ceramic composite material.

20. The article of claim 17, wherein the carrier comprises a ceramic material.

* * * * *

UNITED STATES PATENT AND TRADEMARK OFFICE
CERTIFICATE OF CORRECTION

PATENT NO. : 11,415,893 B2  
APPLICATION NO. : 16/760357  
DATED : August 16, 2022  
INVENTOR(S) : Roux et al.

Page 1 of 1

It is certified that error appears in the above-identified patent and that said Letters Patent is hereby corrected as shown below:

In the Drawings

On sheet 6 of 11, FIG. 4C, Tag S40, Line 1, delete "AHESION" and insert -- ADHESION --, therefor.

Signed and Sealed this  
Eighteenth Day of June, 2024

Katherine Kelly Vidal  
*Director of the United States Patent and Trademark Office*